United States Patent [19]

Cheng

[11] Patent Number: 5,160,402
[45] Date of Patent: Nov. 3, 1992

[54] MULTI-CHANNEL PLASMA DISCHARGE ENDPOINT DETECTION METHOD

[75] Inventor: David Cheng, San Jose, Calif.

[73] Assignee: Applied Materials, Inc., Santa Clara, Calif.

[21] Appl. No.: 528,297

[22] Filed: May 24, 1990

[51] Int. Cl.$^5$ .......................................... H01L 21/00
[52] U.S. Cl. ..................................... 156/627; 156/345; 156/643; 204/192.33
[58] Field of Search ............... 156/626, 627, 345, 643; 204/192.33

[56] References Cited

U.S. PATENT DOCUMENTS

| | | | |
|---|---|---|---|
| 4,207,137 | 6/1980 | Tretola | 156/627 |
| 4,312,732 | 1/1982 | Degenkolb et al. | 204/192 E |
| 4,609,426 | 9/1986 | Ogawa et al. | 156/626 |
| 4,615,761 | 10/1986 | Tada et al. | 156/626 |
| 4,695,700 | 9/1987 | Provence | 219/121 |
| 4,720,628 | 1/1988 | Drake | 250/214 |
| 5,045,149 | 9/1991 | Nulty | 156/627 |

FOREIGN PATENT DOCUMENTS

| | | |
|---|---|---|
| 0320425 | 6/1989 | European Pat. Off. |
| 59-041475 | 3/1984 | Japan |

OTHER PUBLICATIONS

Khoury, "Real-Time Etch Plasma Monitor System", IBM Technical Disclosure System, vol. 25, No. 11A, Apr. 1983.

Primary Examiner—Arthur L. Corbin
Attorney, Agent, or Firm—Paul L. Hickman

[57] ABSTRACT

A plasma discharge endpoint detection system and method characterized by a plurality of individual data channels which are combined to create a composite function representative of the conditions within a plasma etch chamber. Preferably, a number of the channels are representative of spectral components within the optical spectrum caused by the plasma discharge within the etch chamber. A multi-channel sensor assembly is provided for this purpose including a number of light-guides for guiding light from the plasma discharge to filters and photosensors associated with the multiple channels. Other channels can detect various conditions such as the D.C. bias on a cathode within the plasma etch chamber. The various channels are digitized, weighted and summed within a digital computer to create the composite function from which endpoint and other conditions within the chamber can be determined. The method is characterized by the weighting and summing of a plurality of data channels carrying information about the conditions within a plasma etch chamber to develop a composite function and then analyzing the composite function to determine endpoint and other conditions. The endpoint detection method compares the slope of the composite function to a predetermined maximum slope value and identifies endpoint when the maximum slope value is exceeded a predetermined number of times.

12 Claims, 5 Drawing Sheets

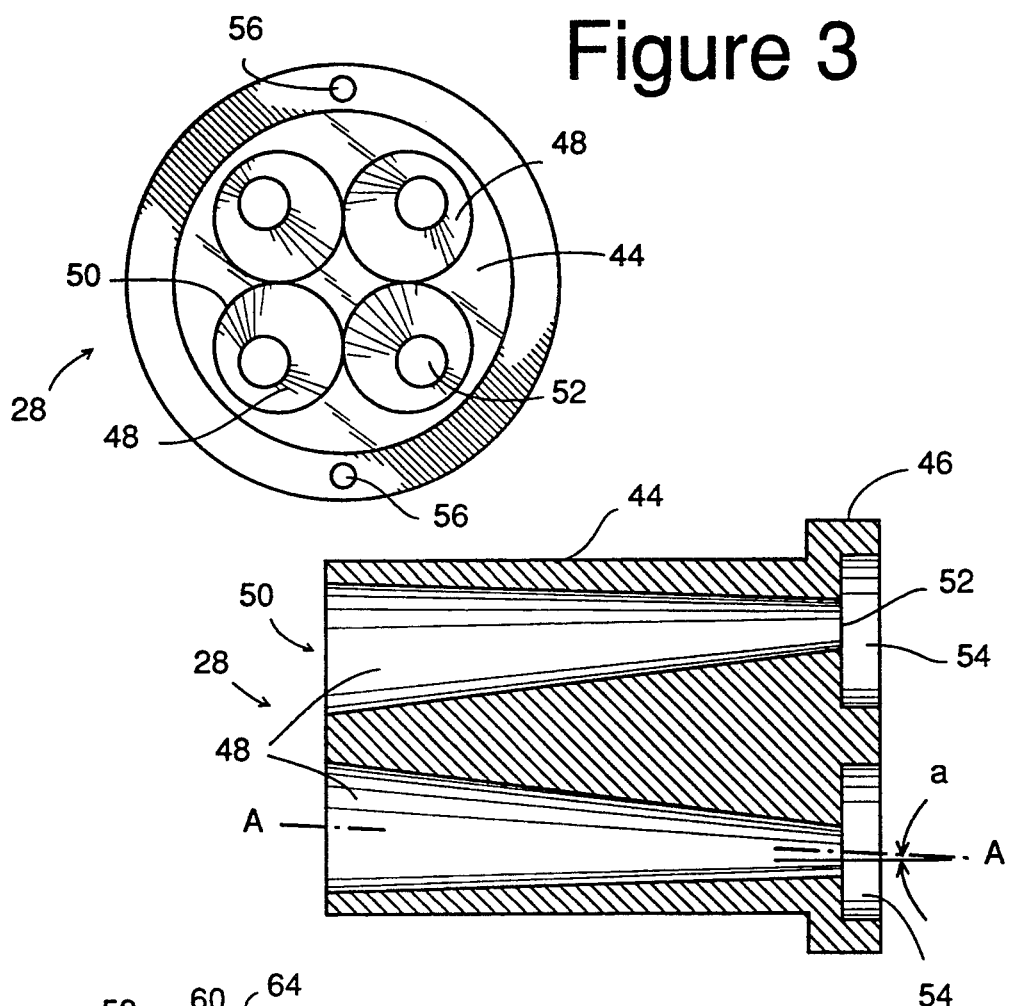
Figure 3
Figure 4
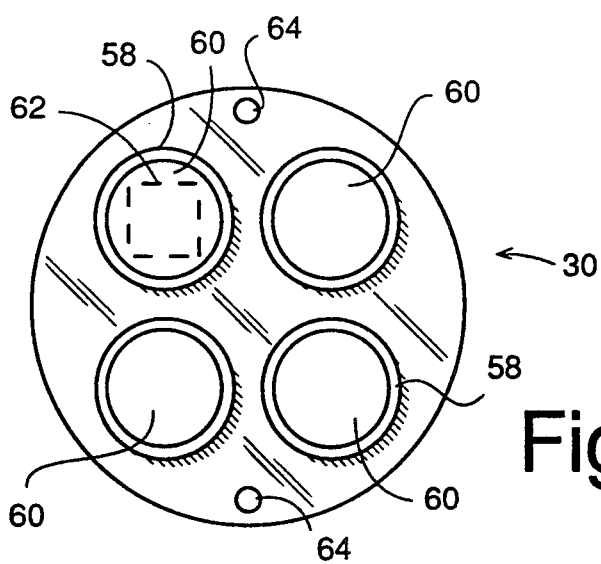
Figure 5

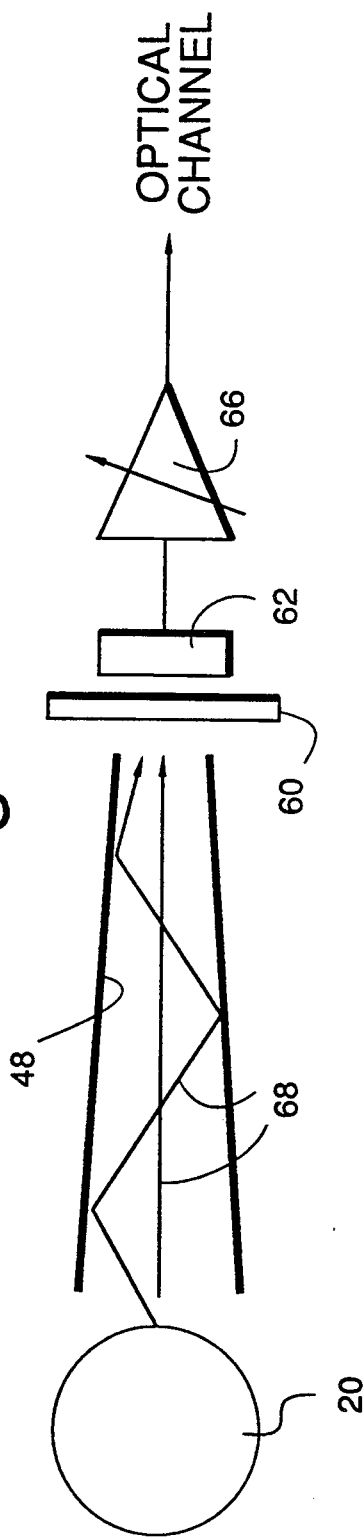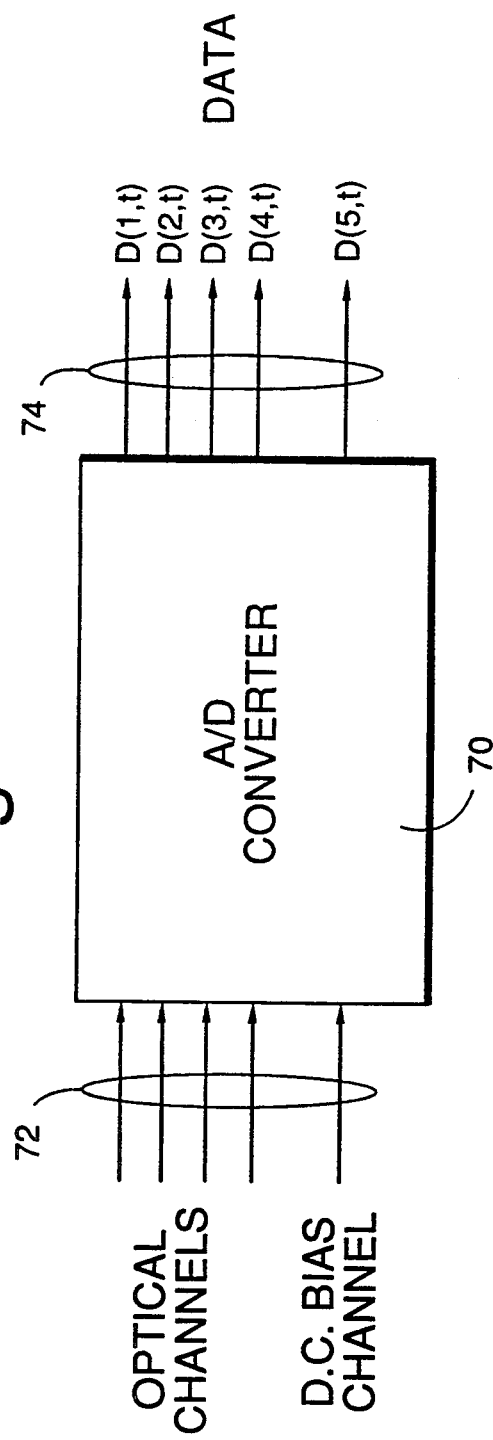

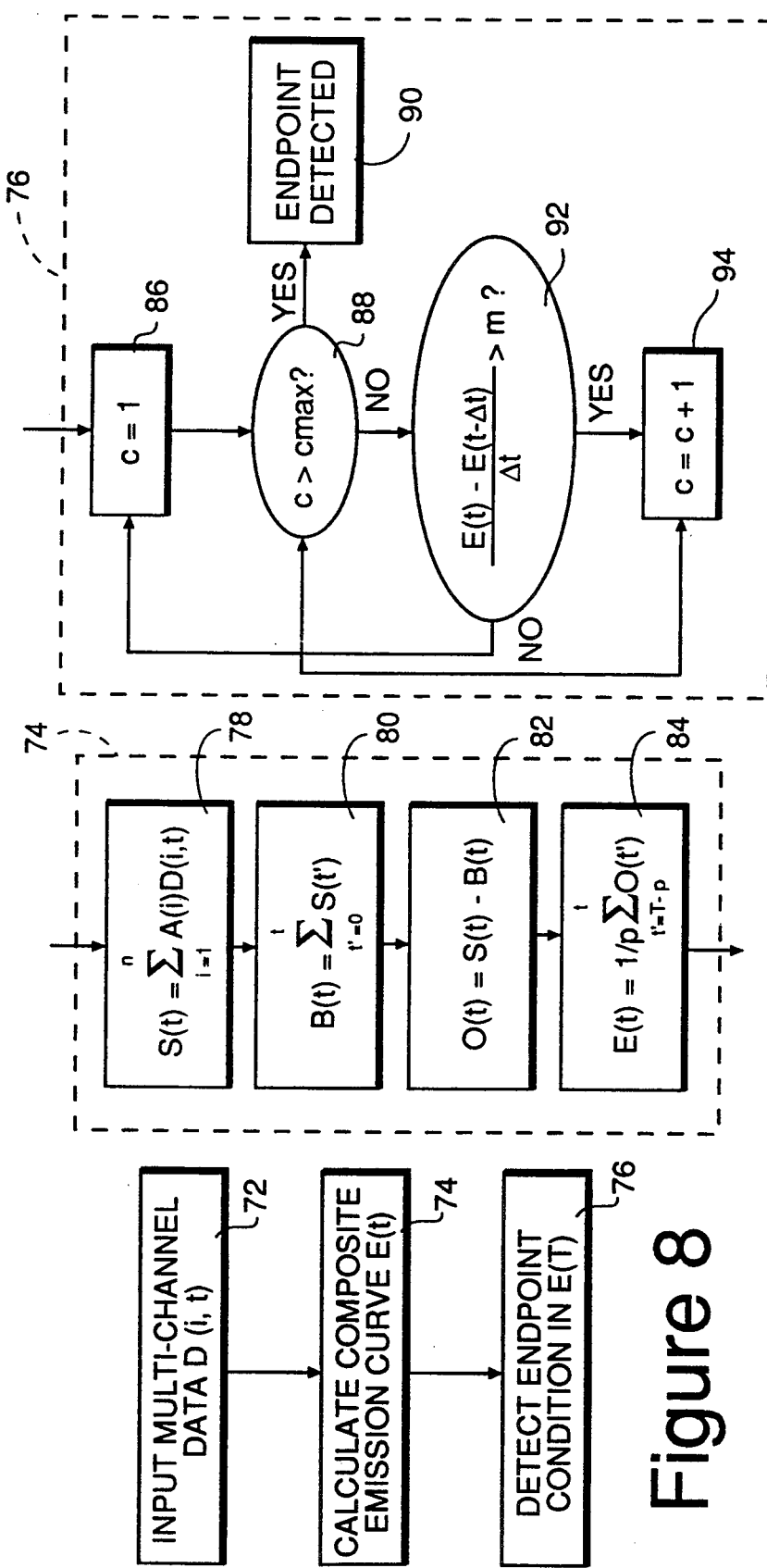

MULTI-CHANNEL PLASMA DISCHARGE ENDPOINT DETECTION METHOD

BACKGROUND OF THE INVENTION

This invention relates generally to plasma etch systems used to process integrated circuit wafers and more particularly to methods and apparatus for detecting endpoint in plasma etch systems.

Plasma etch systems etch layers of an integrated circuit wafer by causing positively charged ions to bombard the surface of the wafer. The ions are produced within a plasma discharge over the wafer and are accelerated towards the wafer by a negatively charged cathode. The plasma discharge within standard plasma etch systems is created by applying radio-frequency (RF) power to both the cathode and an anode of the etch system, while the plasma discharge within reactive ion etch (RIE) systems is created by applying RF power to the cathode alone. In either system, the etch process is highly anisotropic due to the substantially perpendicular acceleration of the positive ions towards the plane of the wafer. Anisotropic etching is desirable because it permits very narrow linewidths to be formed in the integrated circuit wafer.

It is very important to determine when the endpoint of the etch process has been reached. Prior to endpoint some of the etched layer remains and, therefore, the process is incomplete. After endpoint, excessive over-etching can occur, possibly damaging lower layers of the integrated circuit wafer. While a small amount of over-etching is common to ensure complete etching of the desired layer, it is still important to know when nominal endpoint has been reached to achieve accurate and repeatable etching.

There are a number of prior art methods for monitoring endpoint. One such method uses laser interferometry to monitor the layer as it is being etched. Another method monitors the impedance or D.C. bias of the cathode. A third method, and the one most closely related to the present invention, optically monitors the emission of the plasma discharge to determine endpoint conditions.

An example of a method for optically monitoring the plasma discharge within a plasma etch chamber is taught in U.S. Pat. No. 4,312,732 of Degenkolb et al. who describe the optical monitoring of a portion of a spectrum developed by a plasma discharge for changes which would signal endpoint. More particularly, Degenkolb et al. monitor the radiation from a preselected excited species including particles resulting from the chemical combination of entities from the wafer with entities from etchant gasses within the plasma discharge. When the radiation associated with the preselected species diminishes below a predetermined threshold value Degenkolb et al. consider endpoint to have occurred.

A disadvantage of monitoring a single portion of a spectrum as taught by Degenkolb et al. is that the signal-to-noise ratio (SNR) of the signal can be quite low for certain processes. This can cause false readings of endpoint, possibly causing damage to the integrated circuit wafer being processed. Another problem with monitoring a single spectral portion is that endpoint detection is optimized for only one etch process. For example, if different etchant gas concentrations were used or if different materials were being etched the spectral portion chosen for the original etch process might be inappropriate for the new etch process. Furthermore, the prior art method of monitoring a single spectral portion is not well adapted to multiple-step etch processes where a wafer is sequentially subjected to a variety of processing conditions. Multi-step processes can be used to etch a single layer under varying conditions, or can be used to etch multiple layers of differing types.

SUMMARY OF THE INVENTION

The apparatus of the present invention is characterized by a sensor assembly which optically monitors the plasma discharge within a plasma etch chamber and a digital computer system which analyzes the signals produced by the sensor assembly. The sensor assembly includes a plurality of photosensors, each of which is responsive to a different spectral portion of the optical spectrum produced by the plasma discharge. The outputs of the photosensors are amplified to produce a plurality of optical channels which are digitized and input into the digital computer system. Other channels, such as a D.C. bias channel, can also be digitized and input into the computer system. Data from the plurality of channels are mathematically combined within the computer system to form a composite function which, in turn, is analyzed to detect the endpoint condition.

The method of the present invention monitors a plurality parameters associated with the operation of a plasma etch apparatus, forms a composite of the plurality of parameters and analyzes the composite to determine the etch condition within the plasma etch chamber. Each of the plurality of parameters are weighted and then summed, and a D.C. bias level and noise are filtered from the weighted, summed parameters to form the composite. The slope of the composite function is compared to a predetermined value to determine endpoint or other etch conditions within the plasma etch chamber.

An advantage of the present invention is that multiple channels are used to provide redundant emission data which, when combined, increases the sensitivity and signal-to-noise ratio of the detection system. The present invention is also advantageous in that many different etch processes can be monitored by changing the weighting factors of the individual channels. Since the weighting of the channels is preferably performed within a digital computer system, the monitoring process can be quickly and easily modified under software control. In consequence, the present invention can be advantageously used in multi-step etch processing.

These and other advantages of the present invention will become apparent to those skilled in the art upon a reading of the following specifications and a study of the several figures of the drawing.

BRIEF DESCRIPTION OF THE DRAWINGS

FIG. 3 is an end view of a portion of the sensor assembly as seen along line 3—3 of FIG. 2.

FIG. 4 is a cross-sectional view of a portion of the sensor assembly as seen along line 4—4 of FIG. 2.

FIG. 5 is an end view of a portion of the sensor assembly as seen along line 5—5 of FIG. 2.

FIG. 6 is a pictorial diagram illustrating the operation of the photosensors of the system depicted in FIGS. 1–5.

FIG. 7 is a block diagram of an analog-to-digital converter of the system of FIG. 1.

FIG. 8 is a flow diagram illustrating a method for detecting endpoint in accordance with the present invention.

FIG. 9 is a flow diagram illustrating a preferred method for performing the step of calculating a composite emission curve of FIG. 8.

FIG. 10 is a flow diagram illustrating a preferred method for performing the step of detecting an endpoint condition in the composite emission curve of FIG. 8.

DETAILED DESCRIPTION OF THE PREFERRED EMBODIMENTS

Figure 1:
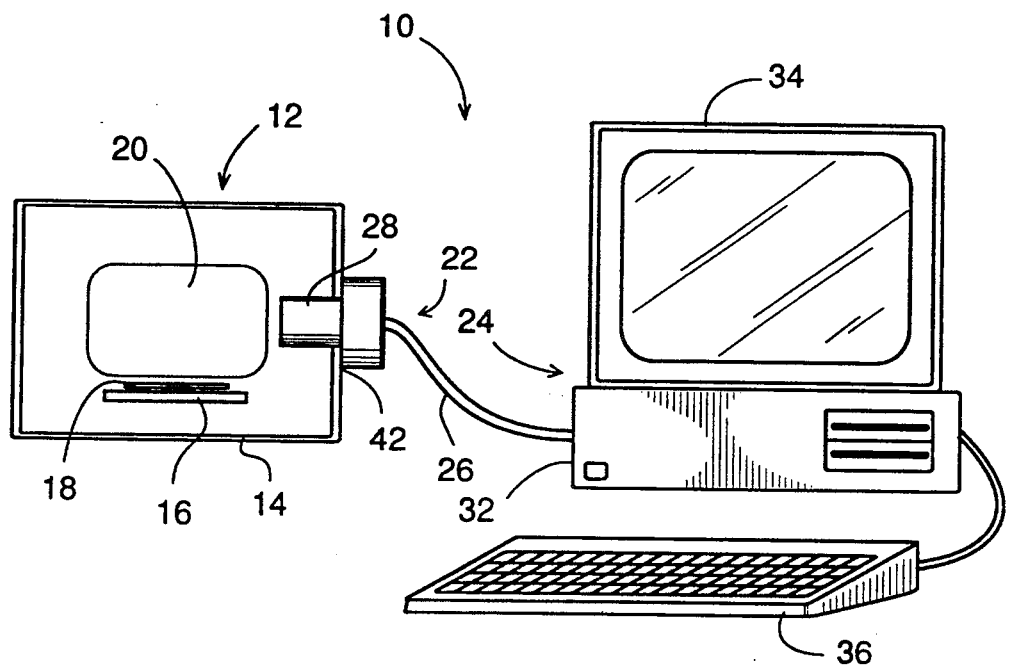
FIG. 1 is a pictorial view of a multi-channel plasma discharge endpoint detection system in accordance with the present invention.

In FIG. 1, an endpoint detection system 10 in accordance with the present invention is coupled to a plasma etch system 12 which includes a chamber 14 and a cathode 16. A semiconductor wafer 18 is supported by the cathode 16, and a plasma discharge 20 is formed over the cathode 16 by applying radio-frequency (RF) power to at least the cathode 16. By "plasma etch system" it is meant herein any system which produces a plasma discharge including conventional plasma etch systems where both a cathode and an anode are RF powered and reactive ion etch (RIE) systems where only the cathode is provided with RF power.

The endpoint detection system 10 includes a sensor assembly 22 and a digital computer system 24 which are coupled together by a cable 26. The sensor assembly 22 has a probe portion 28 which extends into chamber 14 through an aperture in the chamber wall and a housing portion 30 which encloses photosensors and analog circuitry of the sensor assembly. The digital computer system 24 comprises a general purpose digital computer such as a personal computer, workstation or minicomputer made by such well known manufacturers as IBM, Apple, Sun and Hewlett-Packard. The digital computer system 24 typically includes a base unit 32 enclosing the CPU, memory, disk drives and I/O ports, a monitor 34 for visually displaying output from the system and a keyboard 36 for entering commands and data into the system.

Figure 2:
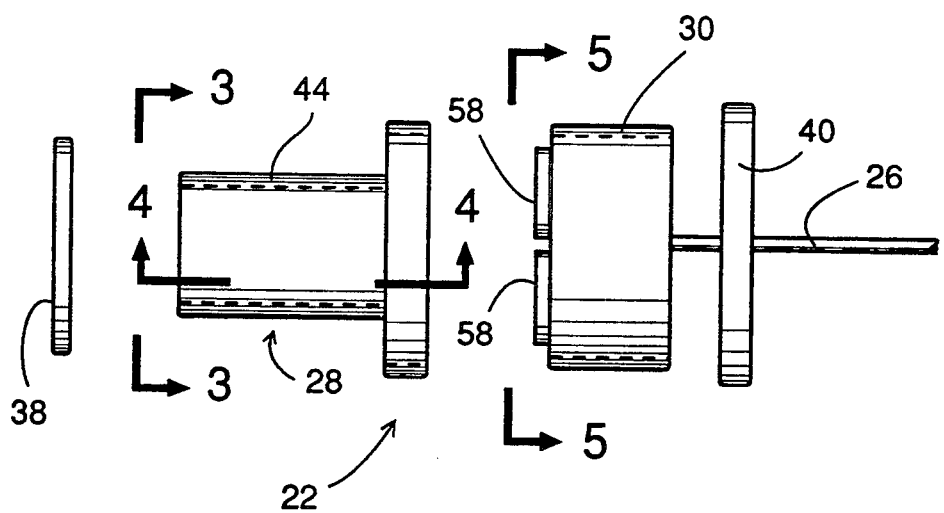
FIG. 2 is an elevational view of the sensor assembly for the system depicted in FIG. 1.

In FIG. 2, the sensor assembly 22 is shown in a partially exploded form to include the probe portion 28 and the housing portion 30. Also shown are a mounting adaptor 38 and a housing end cap 40. The mounting adaptor 38 is preferably a split-ring clamp which is attached to a wall portion 42 of chamber 14 (see FIG. 1) and which clamps around probe portion 28 to hold the sensor assembly 22 firmly to the wall portion 42. The end cap 40 closes the end of the housing portion 30 and permits access to the photosensors and electronic circuitry housed therein. As mentioned previously, cable 26 couples the analog circuitry within the housing portion 30 to the digital computer system 24.

The probe portion 28 is an elongated member including a substantially cylindrical barrel 44 and a substantially cylindrical flange 46 of greater diameter than the barrel. With additional reference to FIGS. 3 and 4, the barrel 44 is provided with a plurality of longitudinally extending bores or holes 48 having a first end 50 and a second end 52. The holes 48 are preferably of a truncated, conical shape having an axis A which is slightly angled by an angle a from the horizontal. The holes 48 serve as light guides which funnel additional electromagnetic radiation from the plasma discharge 20 to the second ends 52 of the holes 48. Preferably, the inner walls surrounding the holes 48 are reflective of the electromagnetic radiation at the frequencies of interest.

The flange 46 is provided with a number of cups 54 which open on second ends 52 of the holes 48. The cups 54 accommodate the filters of the sensor assembly 22 and are somewhat larger in diameter than the first ends 50 of the holes 48. The truncated, conical holes 48 are angled along their axes A as previously described to provide a separation between the cups 54. However, there is no intrinsic reason that the holes 48 could not be a right, truncated cone by making the cups 54 smaller and placing them closer together. Threaded bores 56 are used to attach the probe portion 28 to housing portion 30 with suitable machine bolts (not shown).

In FIG. 5, an end view of the housing portion 30 reveals a number of raised bosses 58, a number of transmissive optical filters 60 and a number of photosensors 62 located behind the optical filters 60. As used herein, the term "photosensor" will mean any photosensitive device capable of creating an electrical signal including, but not limited to, photocells, photoresistors, photomultipliers, etc. The bosses 58 engage the cups 54 of the probe portion 28 such that the filters 60 cover the second ends 52 of the holes 48. It should be noted that the second ends 52 of the holes 48 are smaller in diameter than the diameter of the filters 60. This ensures that the light guided by holes 48 will pass through filters 60 before impinging upon photosensors 62. Housing portion 30 is provided with a pair of unthreaded bore holes 64 through which the aforementioned machine bolts can extend to engage the threaded bores 56 of the probe portion 28.

Each of the filters 60 preferably pass a different spectral component of the spectrum of electromagnetic radiation developed by the plasma discharge 20. As will be discussed in greater detail subsequently, these spectral components are combined to form a composite which is more sensitive and which has a higher signal-to-noise ratio than any one of the spectral components taken individually. In the present embodiment, the spectral components of the filters are centered at 340, 380, 700 and 705 nanometers.

With reference to FIG. 6, variable gain amplifiers such as amplifier 66 are coupled to the outputs of the photosensors 62. The output of an amplifier 66 comprises one optical channel of the detection system. As pictorially illustrated at the left side of the figure, light 68 from the plasma discharge 20 is guided by holes 48 through the filters 60 to photosensors 62. Since the present embodiment includes four guide holes, filters and photosensors the output of the sensor assembly 22 will comprise four optical channels where each channel corresponds to one of four spectral components of the spectrum of electromagnetic radiation produced by the plasma discharge 20.

In FIG. 7 an analog-to-digital (A/D) converter 70 has a number of analog inputs 72 and a corresponding number of digital outputs 74. The four optical channels from the sensor assembly 22 are coupled to four of the analog inputs of the A/D converter 70 and a D.C. bias channel from the cathode 16 of the plasma etch system 12 is coupled to the remaining analog input. As is well known in the art, the D.C. bias of a plasma etch system's cathode can be monitored to signal the endpoint of a plasma etch process. Each of these analog channels is digitized by A/D converter 70 to produce a digital data channel D(i,t) where, in the present invention, i ranges from 1 to 5. The t variable is used to indicate that the data is time variant, i.e. the data D(i,t) will vary in time according to the sampling rate of the A/D converter 70. Multi-channel A/D converters are commercially available as plug-in boards for the base unit 32 of a digital computer system 24. The cable 26 therefore carries the analog optical channels to the digital computer system 24 where they are digitized and input into the computer system.

FIG. 8 is a flow diagram illustrating a method for monitoring for endpoint which runs on the digital computer system 24. In a first step 72 the multi-channel digital data D(i,t) is input from the A/D converter 70. A second step 74 calculates a composite emission curve E(t) from the data D(i,t) and a third step 76 detects an endpoint condition from the composite emission curve E(t).

Step 74 is illustrated in greater detail in FIG. 9. In a step 78, a time-variant sum function S(t) is calculated by summing weighted values of the data D(i,t) at a particular point t in time. The weights are given by the multipliers A(i), which can be positive, negative or zero. In the present embodiment with five digital channels, the sum S(t) of the channels is therefore given by:

$$S(t) = A(1)D(1,t) + A(2)D(2,t) + \ldots + A(5)D(5,t)$$

It should be noted that a datum D(i,t) of a particular channel i can be effectively subtracted in the sum S(t) by providing a negative multiplier A(i) and can be entirely ignored by providing a zero multiplier A(i).

In a step 80, a time variant background function B(t) is developed by calculating a running sum of the sum S(t) from a start time t'=0 to t in discrete increments corresponding to the sampling rate of the A/D converter 70. The background function B(t) is analogous to the D.C. component of the sum S(t) function, and is subtracted from the sum S(t) to form an offset function O(t) in a step 82. In consequence, the offset function O(t) is essentially the same as sum S(t) with the D.C. bias removed.

Finally, in a step 84, the offset function O(t) is digitally filtered to remove undesired frequency components from O(t) and to provide the composite emission function E(t). The digital filter shown in step 84 is a digital notch filter which removes certain low frequency (e.g. approximately ½ hertz) components of the offset function O(t) caused by a rotating magnetic field within a plasma etch system. As a result of these steps, the composite emission function E(t) is a cleaned, unbiased representation of the etch conditions within the plasma etch system 12 as assembled from a number of channels of information.

Step 76 of FIG. 8 is illustrated in greater detail in FIG. 10. In a step 86 a counter c is set to 1. In a decision step 88 the counter c is compared with a value cmax which, in this preferred embodiment is the integer 3. If the counter c is greater than cmax, endpoint is considered to have been reached in a step 90. If c is less than or equal to cmax, the slope of the composite emission function E(t) is calculated at a point in time t to see if the slope of the function is greater than a predetermined maximum slope m. More specifically, the slope is calculated between a point E(t) and a point E(t−Δt), where Δt is a predetermined number of sampling increments before E(t). Of course, the method of determining slope shown in step 92 is by way of example only, since there are many ways of calculating slope such as taking the first derivative of the composite emission function E(t). Also, endpoint can be detected by a negative slope which is less than a predetermined minimum negative slope −m.

Regardless of the actual algorithm used to compare the actual slope of E(t) against a predetermined value, the step 92 branches to step 86 upon a failure of the test condition and branches to a step 94 when the test condition is met. This has the effect of resetting the counter c to 1 if the test condition fails and of incrementing the counter c if the test condition passes. If the test condition of step 92 does pass, the counter c is incremented and compared to cmax in step 88. The effect of this loop is to detect endpoint only after the slope of the composite emission function E(t) is greater than the predetermined slope m cmax consecutive times in a row. This procedure minimizes false endpoint readings caused by noise or other transients in the composite function E(t). Of course, every time step 92 is performed t has been incremented by at least the sampling rate of the A/D converter 70.

Figure 11:
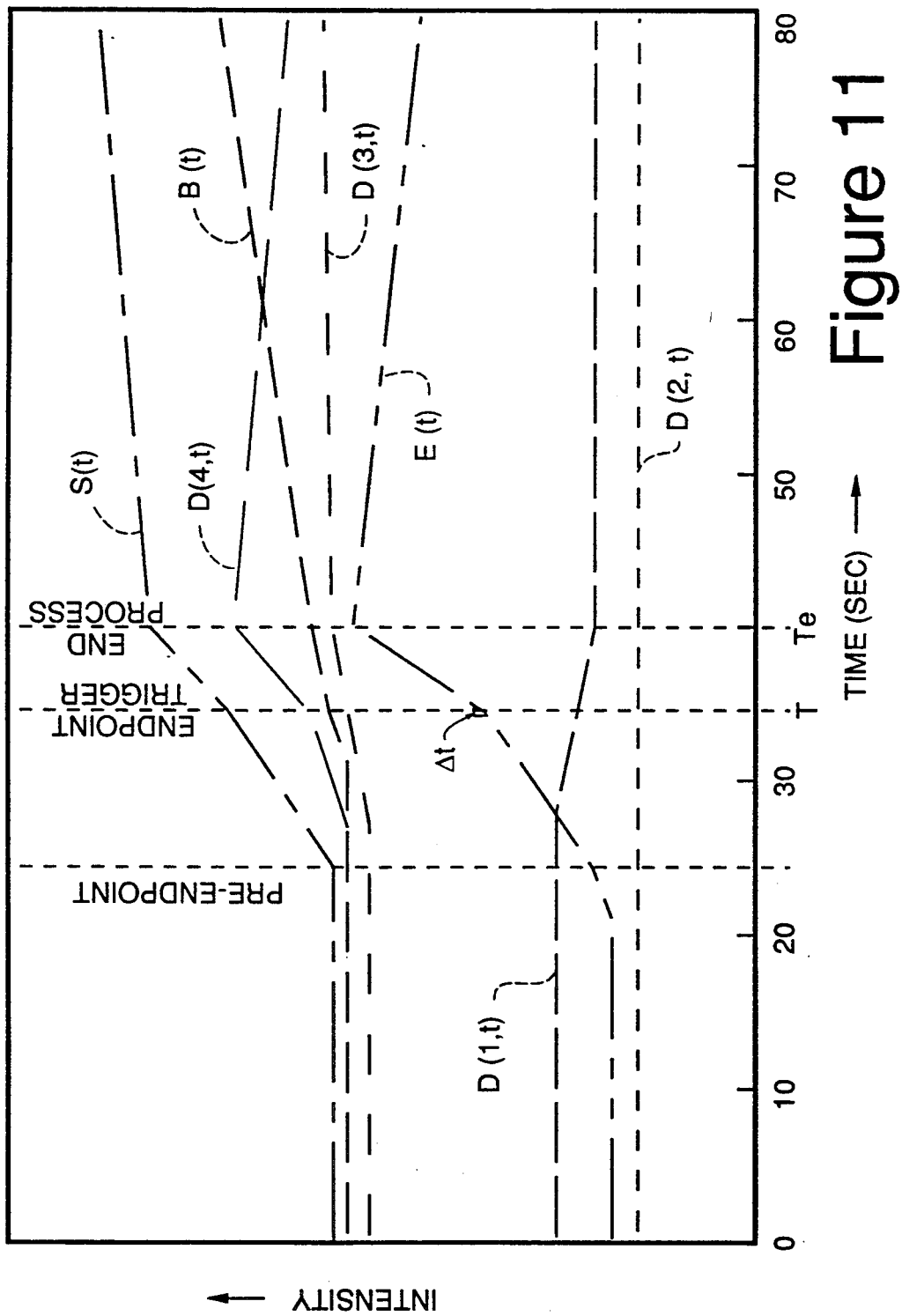
FIG. 11 is a graph illustrating the operation of the apparatus and method of the present invention.

In FIG. 11, a graph of the operation of the method of the present invention as could be seen on monitor 34 of digital computer system 24 is shown. The abscissa of the graph is the time that the plasma etch process has been in progress, while the ordinate of the graph indicates the relative intensity of the various digital signals. The depicted digital signals include a first optical channel D(1,t) corresponding to a spectral component centered at 340 nm, a second optical channel D(2,t) corresponding to a spectral component centered at 380 nm, a third optical channel D(3,t) corresponding to a spectral component centered at 700 nm and a fourth optical channel D(4,t) corresponding to a spectral component centered at 705 nm. The weighting factor or multiplier A(1) for channel D(1,t) was chosen to be −4.00, the multiplier A(2) for channel D(2,t) was chosen to be 0.00, the multiplier A(3) for channel D(3,t) was chosen to be 1.00 and the multiplier A(4) for channel D(4,t) was also chosen to be 1.00. The effects of the D.C. bias channel D(5,t) was eliminated by choosing a multiplier A(5)=0.00. Therefore, the composite emission function ignores the second optical channel and the D.C. bias level in this example.

The sum function S(t) is therefore the sum of the weighted channels D(i,t). As noted, the multiplier A(1) is negative, which effectively subtracts a weighted value of D(1,t) from the sum function S(t). This was done because the function D(1,t) exhibits a negative slope at endpoint while the remaining functions exhibit positive slopes on endpoint. As explained previously the background function B(t) is calculated by taking a running sum of the sum function S(t) and corresponds to the D.C. component of the sum function S(t). Finally, the composite emission curve E(t) is developed by subtracting the background function B(t) from the sum function S(t) and performing whatever filtering function which is deemed desirable.

As previously described, endpoint is detected at a time T when the slope of the composite emission function E(t) is greater than a predetermined value m. Since the time interval Δt is relatively small, endpoint can be approximated by the value T rather than the actual endpoint value of T−Δt. It should be noted that the slope of the composite emission function E(t) starts to rise at a pre-endpoint point Tp in time prior to T, but that this rise is insufficient to exceed the predetermined slope m. It should also be noted that the slope of the function E(t) drops off after an end-of-process point Te in time. The period of time between T and Te corresponds to the over-etch portion of the etch cycle. Therefore, as noted above, the function E(t) can be used to monitor a number of conditions within the plasma etch system 12 and not just the endpoint condition.

The composite emission function E(t) has a number of advantages over any one of the digital channels for the detection of endpoint and other operating conditions. First, by mathematically combining a number of channels the sensitivity of the function is greatly enhanced over any individual one of the channels. This can be seen in the curve E(t) in FIG. 11 where the transitions of the curve E(t) are much more pronounced than the transitions in any one of the channels. Secondly, the signal-to-noise ratio is improved in E(t) because more data is processed allowing the effects of noise and other transients to be minimized. Thirdly, different processes can be monitored by changing the weighting factors A(i) for the various channels. For example, in a first process channels D(1,t) and D(4,t) might be emphasized, while in a second process channels D(2,t), D(3,t) and D(5,t) might be emphasized. In consequence, a variety of different processes or multiple-etch processes can be monitored by changing the mix and weight of the various data channels.

While this invention has been described in terms of several preferred embodiments, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

What is claimed is:

1. A method of monitoring a plasma process which comprises
    (a) optically monitoring a plurality of preselected emission spectra developed by a plasma in a plasma chamber,
    (b) amplifying and digitizing a plurality of spectra signals of said spectra,
    (c) weighting and summing said signals to form a composite function, and
    (d) comparing the slope of the composite function to a predetermined value to determine preselected conditions within said plasma.

2. A method according to claim 1 wherein a D.C. bias channel of a cathode within said plasma chamber is also monitored.

3. A method according to claim 1 wherein the step of forming a composite includes forming a weighted sum of said plurality of spectral components.

4. A method according to claim 1 wherein said composite of said plurality of parameters includes a weighted sum of at least four spectral components.

5. A method according to claim 1 wherein said step of comparing is repeated a plurality of times and wherein endpoint is determined after a number of consecutive comparisons indicate endpoint conditions in said plasma.

6. A method of monitoring the endpoint of a plasma etch process in a plasma etch system which comprises
    (a) collecting a plurality of digital emission signals from said plasma,
    (b) calculating a composite emission curve from said signals by weighting and summing said signals, and
    (c) determining when the slope of said composite curve exceeds a predetermined slope.

7. A method according to claim 6 wherein said signals are obtained from a plurality of portions of an optical spectrum of said plasma.

8. A method according to claim 6 further comprising monitoring the D.C. bias of a cathode within said plasma etch system; and
    forming said composite using both said plurality of spectral components and said D.C. bias.

9. A method according to claim 6 wherein said step of calculating the composite further includes removing the background level from said weighted sum.

10. A method according to claim 9 wherein said step of calculating the composite further includes filtering undesired components from said composite.

11. A method according to claim 9 wherein said step of calculating the composite includes;
    summing said time related sum function over time to develop a time related background function; and
    subtracting said time related background function from said time related sum function to develop a time related offset function.

12. A method according to claim 11 wherein said step of calculating the composite includes;
    performing a notch filter function on said time related offset function to remove undesired components from said time related offset function.

* * * * *